Oct. 7, 1969 KINJI HOSHI ET AL 3,471,754

ISOLATION STRUCTURE FOR INTEGRATED CIRCUIT

Filed March 22, 1967 2 Sheets-Sheet 1

INVENTORS

Kinji Hoshi

Kinji Wakamiya

BY Hill, Sherman, Meroni, Gross & Simpson

ATTORNEYS

Oct. 7, 1969 KINJI HOSHI ET AL 3,471,754

ISOLATION STRUCTURE FOR INTEGRATED CIRCUIT

Filed March 22, 1967 2 Sheets-Sheet 2

INVENTORS
Kinji Hoshi
Kinji Wakamiya

BY Hill, Sherman, Meroni, Gross & Simpson ATTORNEYS

United States Patent Office 3,471,754

Patented Oct. 7, 1969

3,471,754
ISOLATION STRUCTURE FOR INTEGRATED CIRCUITS

Kinji Hoshi, Tokyo, and Kinji Wakamiya, Kanagawa-ken, Japan, assignors to Sony Corporation, Tokyo, Japan, a corporation of Japan Filed Mar. 22, 1967, Ser. No. 625,181
Claims priority, application Japan, Mar. 26, 1966, 41/18,630
Int. Cl. H01l *19/00*
U.S. Cl. 317—235 10 Claims

ABSTRACT OF THE DISCLOSURE

An integrated circuit containing an insulating base having depressions therein with semiconductor pellets being received within the depressions and bonded therein by means of an epitaxial growth layer.

BACKGROUND OF THE INVENTION

Field of the invention

This invention deals with integrated circuits containing circuit elements which may be active or passive, formed in semiconductor pellets which are fixedly secured to depressions of an insulator substrate by means of an epitaxially grown film.

Description of the prior art

Integrated circuits of the past have all provided some means of isolating the circuit elements from each other along the substrate. One method of isolation involved the use of a diffusion technique in a portion of the device which is surrounded by a P-N junction previously produced on a semiconductor substrate. Integrated circuits of this type had a tendency to cause leakage currents by virtue of imperfections in the P-N junction. They could not be used for high frequency operation due to the large electrostatic capacity of a P-N junction.

In another form of isolation, a layer of silicon dioxide was employed as an isolation means about the semiconductor islands. This type of isolation was not particularly satisfactory since the semiconductor substrate and the silicon dioxide layer had different rates of thermal expansion so that their electrical characteristics changed substantially by thermal stresses. This is understandable when it is realized that the thermal expansion coefficient of silicon is about $4.2\times10^{-6}$ cm. per degree C., while that for silicon dioxide is about $5\times10^{-7}$ cm. per degree C.

SUMMARY OF THE INVENTION

In accordance with the present invention, there is provided an insulator base composed of a material having a coefficient of thermal expansion close to that of the semiconductor elements which are to be disposed therein and having depressions therein. The depressions have lateral dimensions which are greater than the corresponding lateral dimensions of the semiconductor pellets so that the pellets are loosely received within the depressions. Then, an epitaxial layer is deposited over the pellets while they are in the depressions, so that the epitaxial film appears between the periphery of the pellets and the walls of the semiconductor pellets. Additional amounts of epitaxial film may be formed on the surface of the base between the depressions. Next, the excess epitaxial film and the portion, if any, of the pellets which protrude beyond the plane of the base are severed off, leaving the pellets bonded to the depressions and having their upper surfaces in coplanar relation with the upper surface of the base. Then, suitable transistor structures can be made by selectively diffusing various impurities into the semiconductor pellets, providing zones of different kinds of conductivity. Finally, suitable electrodes are applied to the passive or active electrical elements thus provided, and the integrated circuit is complete.

With the type of integrated circuit herein provided, low leakage currents exist between the circuit elements. Furthermore, various kinds of semiconductor pellets can be employed in the process so that a wide variety of integrated circuits can be made up with this process. Since the layer which bonds the pellets to the substrate is relatively soft, it is capable of absorbing mechanical stress caused by thermal expansion of the substrate. Transistors produced according to the present invention evidence low collector resistance and therefore may be used for high frequency applications.

DESCRIPTION OF THE PREFERRED EMBODIMENTS

Figure 1:
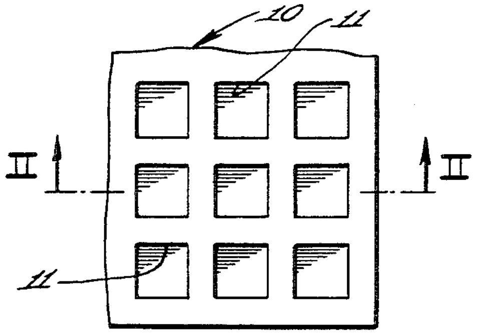
FIGURE 1 is a fragmentary plan view of a substrate used in accordance with the present invention.
Figure 3:
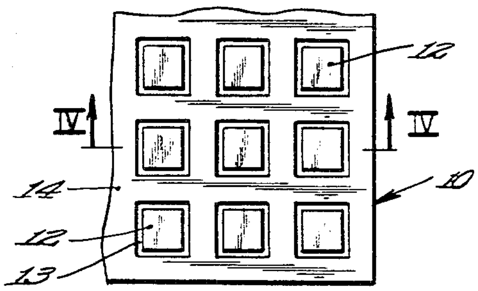
FIGURE 3 is an enlarged plan view of the substrate after the semiconductor pellets have been deposited therein.
Figure 2:
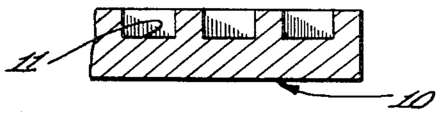
FIGURE 2 is a cross-sectional view taken substantially along the line II—II of FIGURE 1.
Figure 4:
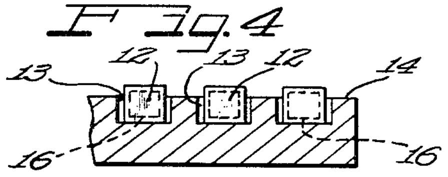
FIGURE 4 is a cross-sectional view taken substantially along the line IV—IV of FIGURE 3.
Figure 5:
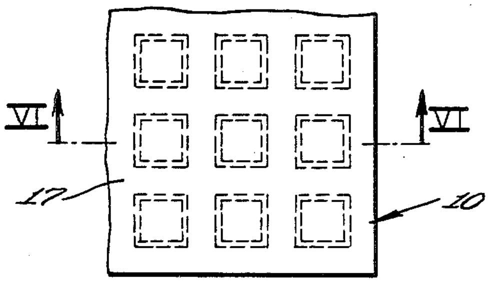
FIGURE 5 is an enlarged plan view of the assembly after the epitaxial layer has been deposited thereon.

In FIGURE 1, reference numeral 10 indicates generally a substrate composed of a material such as sapphire or silicon carbide provided with a plurality of depressions 11. Sapphire and silicon carbide are suitable base materials for silicon semiconductors because they have coefficients of thermal expansion which are reasonably close to that of silicon. The coefficient of thermal expansion for sapphire is about $5\times10^{-6}$ cm. per degree C., while that for silicon carbide is about $4.4\times10^{-6}$ cm. per degree C. In general, the base material should have a coefficient of thermal expansion which does not differ from the semiconductor material used by more than a factor of about 25%.

The substrate 10 is first cut to a suitable thickness such as about 0.5 mm., and then roughly polished, whereupon the depressions 11 can be formed by ultrasonic processing. Typical dimensions of the depressions are a depth of 0.33 mm., and the length and width each 1 mm.

Next, the substrate 10 is etched as in a boiling orthophosphoric acid solution for about thirty minutes to clean the surface of the substrate. After the preparation of the substrate, indvidual single crystal silicon pellets 12 are placed in the depressions 11, the pellets 12 having a size such that they rest on the base of the depressions, but have lateral dimensions which are less than the lateral dimensions of the depressions, thereby leaving spaces 13 between the pellets and the walls of the depressions. The height of the pellsets 12 is also such that the pellets extend slightly above the upper surface 14 of the substrate 10.

The pellets 12 can be of any suitable conductivity type, depending upon the type of electrical element which is to be formed in the final integrated circuit. For example, the pellets may consist of N type silicon having a resistivity of 3 ohm centimeters. If desired, the silicon pellets can be pretreated to provide a diffused zone 16 of a high impurity layer thereby providing an N+ conductivity layer about the periphery of the pellets.

The next step consists of forming an epitaxial layer 17 over the face of the substrate 10 and extending into the spaces 13 existing between the pellets 12 and the walls of the depressions 11. A typical procedure for forming the epitaxial growth layer consists in heating the substrate to about 1200° C., and then treating it with a gas stream containing vapors of silicon tetrachloride and hydrogen gas. This procedure results in the production of an epitaxial layer 17 having a film **17*a* deposited within the depression and bonding the pellets 12 to the depression 11, and the surface film 17*b* which extends between the individual semiconductor pellets. A silicon epitaxial layer has good adhesive properties for both a sapphire substrate and the silicon pellets. The epitaxial growth layer 17*a* formed on the pellets themselves in generally a single crystal layer, whereas that formed above the substrate surface at 17*b*** is normally a polycrystalline layer.

Figure 7:
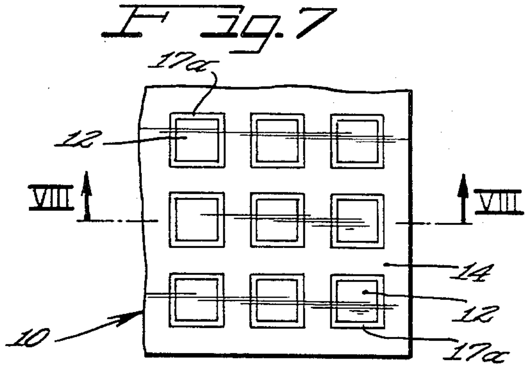
FIGURE 7 is an enlarged plan view of the assembly after the excess epitaxial layer has been removed therefrom.
Figure 6:
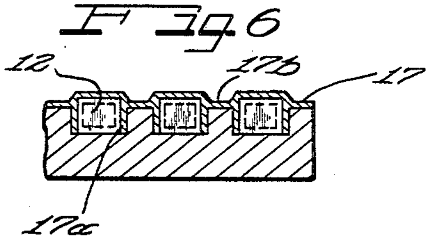
FIGURE 6 is a cross-sectional view taken substantially along the line VI—VI of FIGURE 5.
Figure 8:
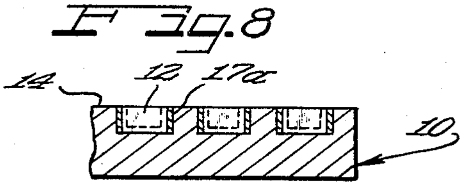
FIGURE 8 is a cross-sectiona view taken substantially along the line VIII—VIII of FIGURE 7.

Turning now to FIGURES 7 and 8, it will be seen that the next step consists in removing the epitaxial growth layer appearing on the surface of the substrate and on the pellets, as well as removing the upper portion of the high impurity layer 16 surrounding the pellets 12. This can be done by polishing and lapping for several hours using a diamond paste abrasive. Since the Mohs hardness of sapphire and silicon are 9 and 7, respectively, the polishing speed suddenly slows down when the lapping surface of the pellet 12 reaches the same plane as the plane of the substrate 10. This change in polishing speed can be used as a means for determining the time at which the polishing operation can be terminated.

Figure 9:
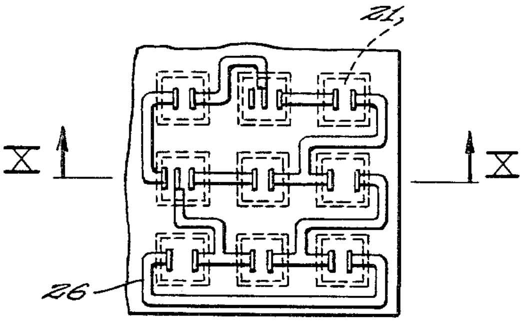
FIGURE 9 is an enlarged plan view of a completed integrated circuit produced according to the present invention.
Figure 12:
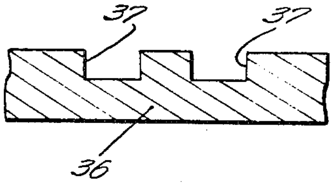
FIGURE 12 is an enlarged fragmentary cross-sectional view of a substrate which can be used in accordance with a modified form of the present invention.
Figure 10:
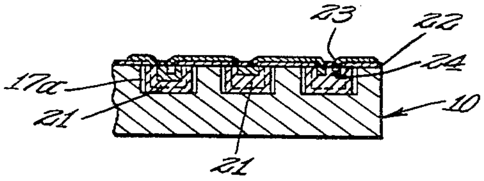
FIGURE 10 is a cross-sectional view taken substantially along the line X—X of FIGURE 9.
Figure 14:
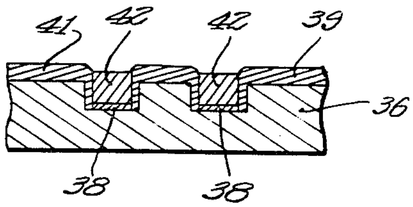
FIGURE 14 is a view similar to FIGURES 12 and 13 but illustrating the appearance of the assembly after the deposition of the epitaxial layer.

The semiconductor pellets, now thoroughly bonded to the substrate 10 can then be treated by the usual diffusion techniques to provide areas of varying conductivity types. Such areas are indicated in FIGURES 9 and 10 at reference numeral 21. A silicon dioxide layer 22 is formed over the surface of the substrate 10, and a plurality of windows 23 are etched out or otherwise formed in the silicon dioxide layer 22. Metallic electrodes 24 are exposed through the windows 23 and are suitably connected by means of conductive wiring 26 formed by vapor deposition techniques or other techniques common for printed circuitry.

Figure 11:
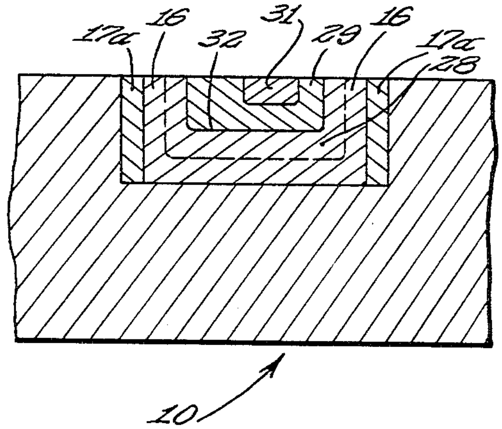
FIGURE 11 is a still further enlarged view of a portion of the integrated circuit shown in FIGURES 9 and 10, with the electrodes being removed for purposes of clarity.

A greatly enlarged view of a transistor produced according to the present invention is illustrated in FIGURE 11 of the drawings. This transistor includes a collector region 28, a base region 29 and an emitter region 31, all formed by suitable diffusion techniques for impurity diffusion, these techniques being old and well known in the art. Since the outer periphery of the semiconductor has the high impurity layer 16, there is no possibility that aluminum present in the sapphire substrate 10 could diffuse into the silicon pellet 12 during the diffusion processes to convert the resistivity of the silicon from N type to P type. The collector junction 32 in this type of transistor is in a low impurity area, while the collector electrode may be formed in a high impurity region, so that the collector resistance is small and the transistor may be used for high frequency applications.

Figure 13:
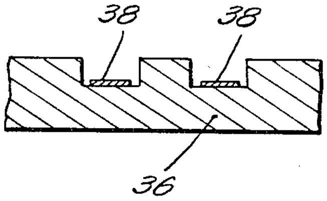
FIGURE 13 is a view similar to FIGURE 12 but illustrating the incorporation of the semiconductor elements in the substrate.
Figure 15:
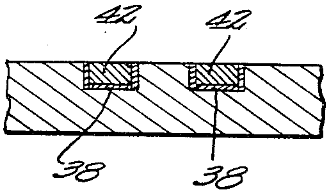
FIGURE 15 is an enlarged cross-sectional view of the completed integrated circuit produced by the steps shown in FIGURES 12 to 14 inclusive.

In the form of the invention illustrated in FIGURES 12 to 15, inclusive, there is provided an insulator substrate 36 having depressions 37 formed therein. In this form of the invention, single crystal thin silicon plates 38 are laid at the base of the depressions 37 in spaced relation to the walls of the depression as illustrated in FIGURE 13. Then, an epitaxial growth layer 39 is formed over the surface of the substrate 36 to provide a surface layer 41 between the depressions 38, and an overlying layer 42 above the silicon plates 38. The epitaxial growth process results in the production of a polycrystalline structure in the film 41 and essentially a single crystal extension of the silicon plate 38 in the area 42. Next, the excess epitaxial layer is removed by polishing or lapping to cut down the epitaxial layer to be coplanar with the upper surface of the substrate 36 as best illustrated in FIGURE 15. In the single crystal region 42, the circuit elements can be formed in the semiconductor by the usual diffusion techinques to obtain an integrated circuit.

From the foregoing, it should be evident that the process of the present invention provides a convenient means for bonding semiconductor pellets to a substrate in the manufacture of integrated circuits. The leakage currents evidenced by these circuits are low, the resistance to thermal stress is high and the elements can be used at high frequencies.

It should be evident that various modifications can be made to the described embodiments without departing from the scope of the present invention.

We claim as our invention:

1. An integrated circuit comprising a refractory insulating base having a plurality of depressions in its surface, a semiconductor pellet in at least some of said depressions, said base having a coefficient of thermal expansion close to that of said pellet, each semiconductor pellet having lateral dimensions such that it is spaced from the walls of the depression, each of said semiconductor pellets having electrical elements formed therein, and an epitaxial growth layer between said pellet and the walls of said depression bonding said pellet within said depression.

2. The circuit of claim 1 in which said base has a coefficient of thermal expansion within 25% of the thermal expansion coefficient of the semiconductor pellets.

3. The circuit of claim 1 in which said base is composed of sapphire.

4. The circuit of claim 1 in which said base is composed of silicon carbide.

5. The circuit of claim 1 in which said pellets are composed of silicon.

6. The method of making an integrated circuit which comprises providing an insulating base having a plurality of depressions in its surface, placing semiconductor pellets in said depressions, depositing an epitaxial growth layer within said depressions to anchor said pellets therein, removing any excess epitaxial growth layer from the surface of said base, and forming zones of different conductivity types in said pellets.

7. The method of claim 6 in which said pellets extend above the surface of said base and are cut down flush with the surface of said base after deposition of said epitaxial growth layer.

8. The method of claim 6 in which said base is composed of a material having a coefficient of thermal expansion close to that of the semiconductor pellets.

9. The method of claim 6 in which said base is composed of sapphire.

10. The method of claim 6 in which said base is composed of silicon carbide.

References Cited

UNITED STATES PATENTS

| | | | |
|---|---|---|---|
| 2,817,048 | 12/1957 | Thuermel et al. | 317—234 |
| 3,128,332 | 4/1964 | Burkig et al. | 174—68.5 |
| 3,133,336 | 5/1964 | Marinace | 29—25.3 |
| 3,169,892 | 2/1965 | Lemelson | 148—6.3 |
| 3,377,513 | 4/1968 | Ashby et al. | 317—101 |

JAMES D. KALLAM, Primary Examiner

U.S. Cl. X.R.

29—626, 576; 317—101